United States Patent
Kao et al.

(10) Patent No.: US 6,176,770 B1
(45) Date of Patent: Jan. 23, 2001

(54) GRINDSTONE HAVING A VACUUM SYSTEM IN A PIN CHUCK STEPPER

(75) Inventors: Chung-Hsien Kao, Yunlin Hsien; Patrick Cheng, Kaoshiung Hsien; Li-Chung Lee, Ilan Hsien; Mei-Ling Chen, Hsinchu Hsien, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/494,522

(22) Filed: Jan. 31, 2000

(51) Int. Cl.[7] ....................................................... B24B 55/06
(52) U.S. Cl. ............................................. 451/456; 451/388
(58) Field of Search .................................... 451/456, 388, 451/354, 164

(56) References Cited

U.S. PATENT DOCUMENTS

| | | | |
|---|---|---|---|
| 4,213,698 | * | 7/1980 | Firtion et al. .......................... 451/388 |
| 4,697,389 | * | 10/1987 | Romine ................................. 451/456 |
| 5,197,089 | * | 3/1993 | Baker ....................................... 378/34 |
| 5,540,616 | * | 7/1996 | Thayer ................................... 451/456 |
| 6,032,997 | * | 3/2000 | Elliot et al. .......................... 294/64.1 |

* cited by examiner

Primary Examiner—Robert A. Rose
(74) Attorney, Agent, or Firm—Jiawei Huang; J. C. Patents

(57) ABSTRACT

A grindstone having a vacuum system is applied to a pin chuck stepper. The vacuum system has a vacuum tube attached on the edge of the grindstone. When the grindstone moves on a pin chuck stage on the pin chuck stepper, the vacuum tube vacuums the pin chuck stage to free particles on the pin chuck stage.

4 Claims, 3 Drawing Sheets

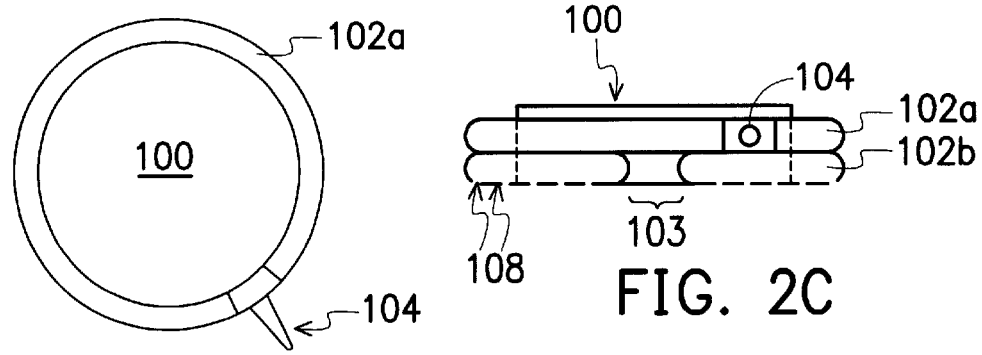
FIG. 2A
FIG. 2C
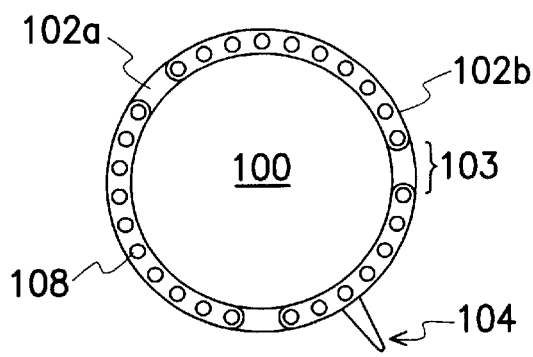
FIG. 2B
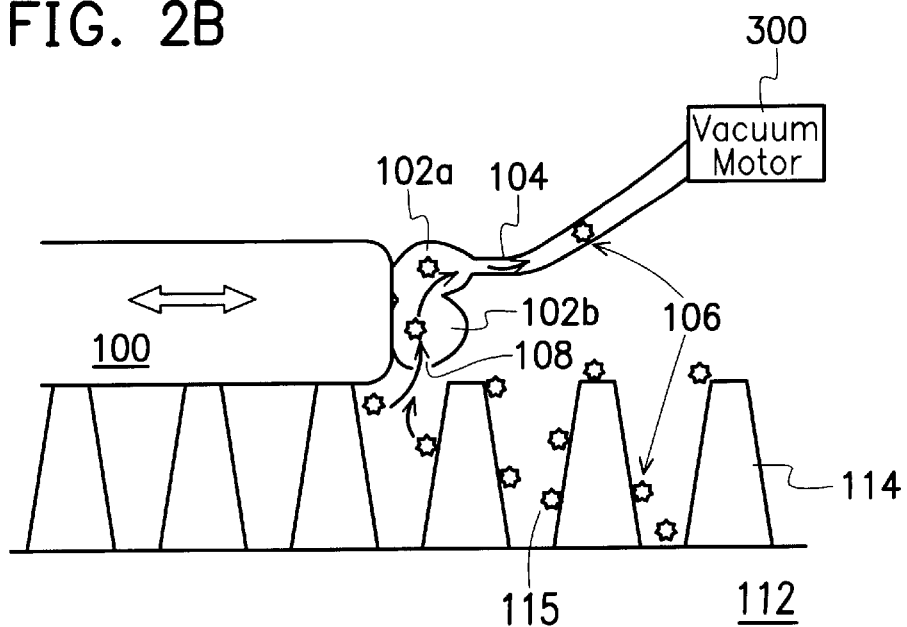
FIG. 3

GRINDSTONE HAVING A VACUUM SYSTEM IN A PIN CHUCK STEPPER

BACKGROUND OF THE INVENTION

1. Field of the Invention

The present invention relates to a grindstone in a pin chuck stepper. More particularly, the present invention relates to a grindstone having a vacuum system in a pin chuck stepper.

2. Description of the Related Art

In a semiconductor process, a semiconductor wafer is fixed on a stage of a stepper in order to obtain a desired pattern on the semiconductor wafer through an exposure and development process. This is known as a photolithography process. Conventionally, the stage of the stepper is a ring-type stage, and the ring is a continuous coil. However, the semiconductor wafer cannot be horizontally placed on the ring while the particles produced during processes stick on the surface of the ring. As a result, the light cannot be precisely focused on the semiconductor wafer, and the quality of photolithography is seriously affected. Conventionally, such a situation can be prevented by using a particle-free cloth and alcohol to clean the surface of the stage.

The problem of the particles sticking on the surface of the ring stage can be minimized by decreasing the surface area on which the particles can stick. Thus, a pin chuck stage is introduced to a stepper. FIG. 1A is a schematic, cross-sectional view showing a pin chuck stage, and showing a problem resulting from the introduction of the pin chuck stage according to the prior art.

Referring to FIG. 1A. a pin chuck stage 12 is introduced to a stepper to decrease the surface area on which the particles 16 can stick, which is possible because the surface areas of the pins 14 are much smaller than that of the ring. However, it is impossible to totally prevent the particles from sticking to the tiny areas of the pins 14. Thus, a smooth ceramic grindstone 10 is used to sweep the particles 16 from the surfaces of the pins 14 by pushing the particles 16 into gaps 15 between pins 14 as shown in FIG. 1A. However, the particles 16 can lift and stick on the surfaces of the pins 14 again while the stage is moving or the air is flowing. Furthermore, the pin chuck stage 12 cannot be cleaned with a particle free cloth and alcohol because fibers of the cloth may entangle with the pins and damage the pin chuck stage 12.

In addition, the particles 16 can be easily accumulated in the dead space 20 between the stage 12 and the pre-alignment element 18, as shown in FIG. 1B, because of the motion of the grindstone 10. In fact, the particle contamination mainly results in the particles sticking in the dead space 20 in a photolithography process, and it is very difficult to get rid of the particles stuck in the dead space 20. This is a problem difficult to overcome while using a pin chuck stage in a stepper.

SUMMARY OF THE INVENTION

According to above, the invention provides a grindstone having a vacuum system in a pin chuck stepper to vacuum particles while the grindstone is sweeping the particles away.

The vacuum system comprises a two-layer ring tube and is attached on the edge of the grindstone. The two-layer ring tube comprises a continuous ring upper tube having a joint connected to a vacuum motor and a plurality of sausage-shaped lower tubes wherein the ring upper tube communicates with the plurality of sausage-shaped lower tubes. The sausage-shaped lower tubes are separated from each other by a space which can include a pre-alignment element, and there is a plurality of openings for inhaling particles into the stage on bottoms of the sausage-shaped lower tubes. The vacuum system is activated while the grindstone is moving on the pin chuck stage; thus particles can be inhaled by the vacuum system while the particles are pushed into gaps between pins on the pin chuck stage by the grindstone. In addition, when the grindstone is moved to a pre-alignment element, since there is a space between the sausage-shaped lower tubes, the pre-alignment element is wedged in the space between the sausage-shaped lower tubes. Then, the particles stuck in the dead space between the chuck and the pre-alignment element can be easily inhaled by the vacuum system.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2A is a schematic, top view showing a grindstone having a vacuum system according to a preferred embodiment of the invention;

FIG. 2B is a schematic, bottom view showing a grindstone having a vacuum system according to a preferred embodiment of the invention;

FIG. 2C is a schematic, cross-sectional view showing a grindstone having a vacuum system according to a preferred embodiment of the invention;

FIG. 3 is a schematic, cross-sectional view showing the operation of the vacuum system attached on the edge of the grindstone according to a preferred embodiment of the invention;

DESCRIPTION OF THE PREFERRED EMBODIMENTS

Figure 1A:
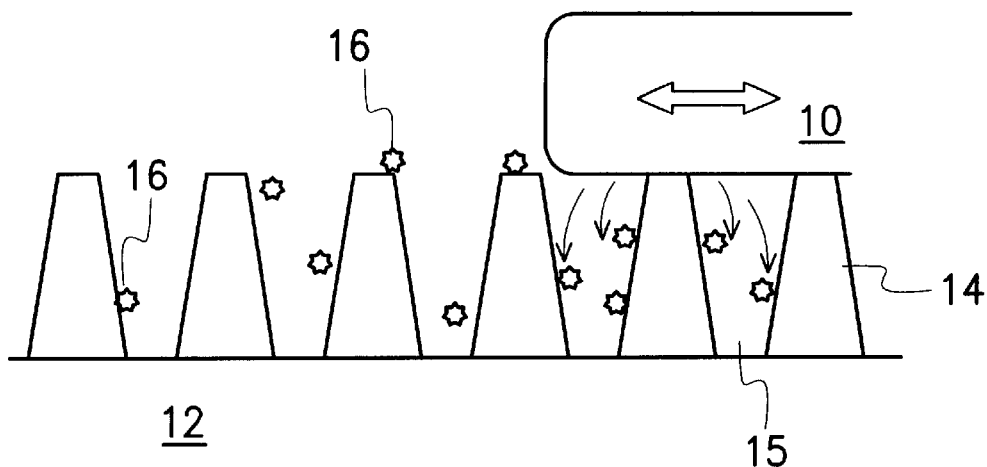
FIG. 1A is a schematic, cross-sectional view showing a pin chuck stage, and showing a problem resulting from the introduction of the pin chuck stage according to the prior art.
Figure 1B:
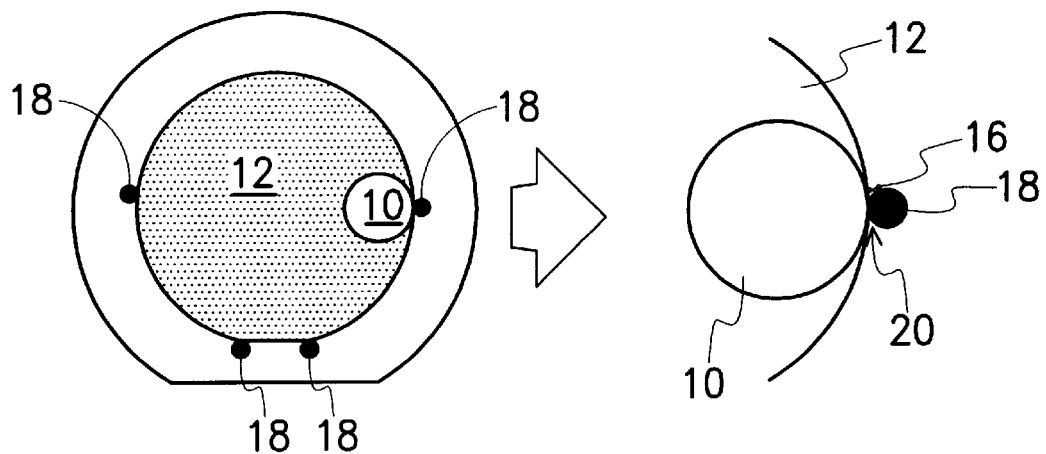
FIG. 1B is a schematic view showing the incapability of the grindstone in sweeping away the particles in the dead space between a pre-alignment element and the pin chuck stage according to the prior art.

The invention provides a grindstone having a vacuum system in a stepper to completely clean away the particles stuck on the pin chuck stage and in the dead space between the pre-alignment element and the pin chuck stage.

FIG. 2A is a schematic, top view showing the grindstone having the vacuum system, FIG. 2B is a schematic, bottom view showing the grindstone having the vacuum system, and FIG. 2C is a schematic, cross-sectional view showing the grindstone having the vacuum system according to a preferred embodiment of the invention.

Referring to FIG. 2A through FIG. 2C, the vacuum system comprises a two-layer ring tube 100 and is attached on the edge of the grindstone 100. The two-layer ring tube 100 comprises a continuous ring upper tube 102a having a joint 104 connected to a vacuum motor and a plurality of sausage-shaped lower tubes 102b wherein the ring upper tube 102a communicates with the plurality of sausage-shaped lower tubes 102b. The diameters of the upper tube 102a and the lower tube 102b are preferably about 0.4–0.5 cm. The plurality of sausage-shaped lower tubes 102b are separated from each other by a space 103 in which the pre-alignment element 118 (as shown in FIG. 4A and FIG. 4B) can wedge, and there is a plurality of openings 108 for inhaling particles 106 on the stage in the bottoms of the sausage-shaped lower tubes 102b.

FIG. 3 is a schematic cross-sectional view showing the operation of the vacuum system attached to the edge of the grindstone according to a preferred embodiment of the invention.

Referring to FIG. 3 the vacuum system is activated while the grindstone 100 is moving on the pin chuck stage 112. The pin chuck stage 112 has uniformly-distributed pins 114 thereon. Due to the operation of the vacuum motor 300, particles 106 can be inhaled by the vacuum system from the openings 108 through the lower tube 102b and then the upper tube 102a, and exhausted through the joint 104 while the particles are pushed into gaps 115 between pins 114 on the pin chuck stage 112 by the grindstone 100. In order to efficiently inhale the particles 106, the sizes of the openings 108 should be larger than the particles 106. Preferably, the diameters of the openings 108 are about 1.5–3 $\mu$m.

Figure 4A:
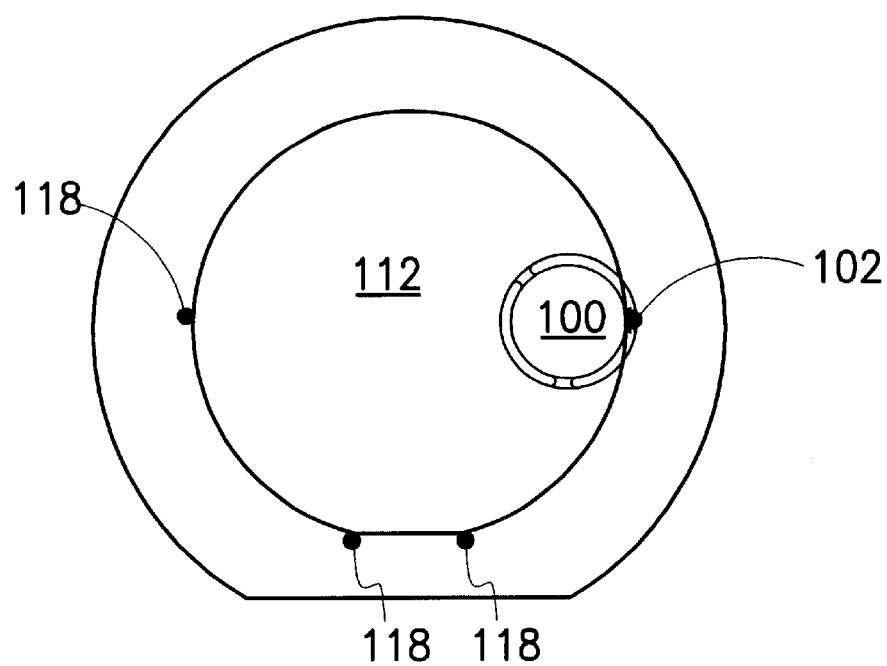
FIG. 4A is a schematic, bottom view showing the mechanical relationship between a pre-alignment element and the pin chuck stage according to a preferred embodiment of the invention.
Figure 4B:
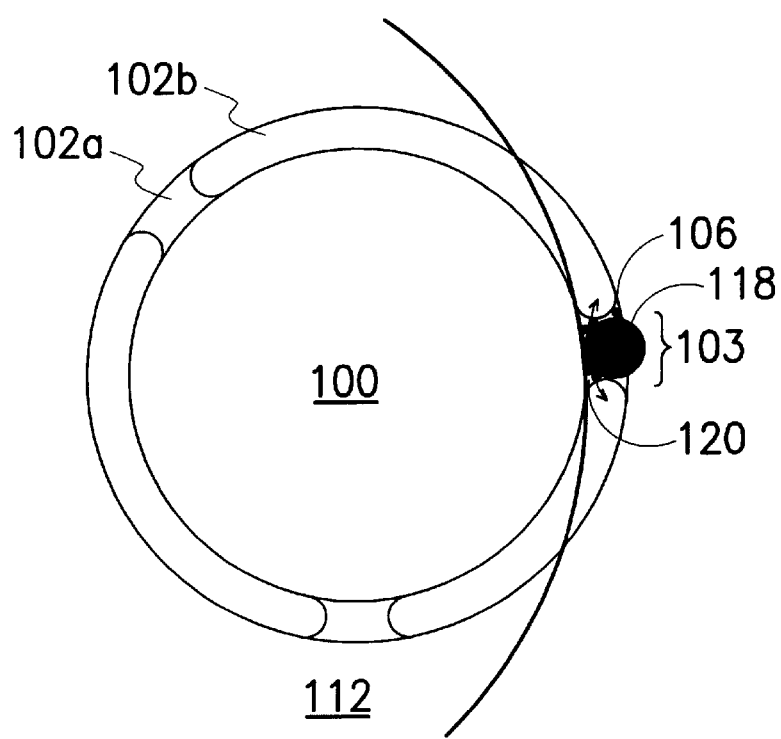
FIG. 4B is a schematic, enlarged view showing the mechanical relationship between a pre-alignment element and the pin chuck stage according to a preferred embodiment of the invention.

FIG. 4A is a schematic, bottom view showing the mechanical relationship between pre-alignment elements 118 and the pin chuck stage 112, and FIG. 4B is a schematic. enlarged view showing the mechanical relationship between the pre-alignment elements 118 and the pin chuck stage 112 according to a preferred embodiment of the invention.

Referring to FIG. 4A through FIG. 4B, when the grindstone 100 is moved to one of the pre-alignment elements 118, since the space 103 exists between the sausage-shaped lower tubes 102b. the pre-alignment element 118 is wedged in the space 103 between the sausage-shaped lower tubes 102b. Then, the particles 106 stuck in the dead space 120 between the pin chuck stage 112 and the pre-alignment element 118 can be easily inhaled by the vacuum system.

Thus, the grindstone having the vacuum system provided by the invention in a stepper can efficiently and completely clean away the particles stuck on the pin chuck stage and in the dead space between the pre-alignment element and the pin chuck stage. The invention solves the problem of particle contamination that occurs in a stepper with a pin chuck stage.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A system for cleaning particles off of a pin chuck stage in a photolithography stepper, the system comprising:
    a grindstone that sweeps the particles into gaps between pins by movement of the grindstone on the pin chuck stage;
    a vacuum system attached on an edge of the grindstone and through which the particles in the gaps between pins are inhaled wherein the vacuum system comprises a two-layer ring tube; and
    a vacuum motor connected with the vacuum system to generate a suction to inhale the particles while the grindstone is moving on the pin chuck stage.

2. A system for cleaning particles off of a pin chuck stage in a photolithography stepper, the system comprising:
    a grindstone that sweeps the particles into gaps between pins by movement of the grindstone on the pin chuck stage;
    a vacuum system attached on an edge of the grindstone and through which the particles in the gaps between pins are inhaled, wherein the vacuum system comprises a two-layer ring tube, and the two-layer ring tube comprises a continuous ring upper tube having a joint and a plurality of sausage-shaped lower tubes beneath the continuous ring upper tube, wherein the ring upper tube communicates with the plurality of sausage-shaped lower tubes separated from each other by a space including a pre-alignment element, and there is a plurality of openings on the bottoms of the sausage-shaped lower tubes for inhaling particles from the stage; and
    a vacuum motor connected with the vacuum system through the joint on the continuous ring upper tube that generates a suction to inhale the particles while the grindstone is moving on the pin chuck stage.

3. The system of claim 2, wherein the continuous ring upper tube and the plurality of sausage-shaped lower tubes have diameters of about 0.4–0.5 cm.

4. The system of claim 2, wherein the openings have diameters of about 1.5–3 $\mu$m.

* * * * *